United States Patent
Feiweier et al.

(10) Patent No.: US 10,185,018 B2
(45) Date of Patent: Jan. 22, 2019

(54) METHOD FOR MOTION CORRECTION IN MAGNETIC RESONANCE IMAGING AND MAGNETIC RESONANCE IMAGING APPARATUS

(71) Applicant: SIEMENS HEALTHCARE GMBH, Erlangen (DE)

(72) Inventors: Thorsten Feiweier, Poxdorf (DE); Martin Harder, Nuernberg (DE); Tobias Kober, Lausanne (CH)

(73) Assignee: Siemens Healthcare GmbH, Erlangen (DE)

( * ) Notice: Subject to any disclaimer, the term of this patent is extended or adjusted under 35 U.S.C. 154(b) by 367 days.

(21) Appl. No.: 15/131,232

(22) Filed: Apr. 18, 2016

(65) Prior Publication Data

US 2016/0313432 A1  Oct. 27, 2016

(30) Foreign Application Priority Data

Apr. 22, 2015 (EP) ..................................... 15164672

(51) Int. Cl.
*G01R 33/48* (2006.01)
*G01R 33/565* (2006.01)
(Continued)

(52) U.S. Cl.
CPC ..... *G01R 33/56509* (2013.01); *G01R 33/563* (2013.01); *G01R 33/5608* (2013.01); *G01R 33/543* (2013.01)

(58) Field of Classification Search
CPC .......... G01R 33/56509; G01R 33/5608; G01R 33/563; G01R 33/543
(Continued)

(56) References Cited

U.S. PATENT DOCUMENTS 5,539,312 A * 7/1996 Fu ..................... G01R 33/56509
                                                            324/309
6,292,683 B1 * 9/2001 Gupta .................... A61B 5/055
                                                            324/307
(Continued)

FOREIGN PATENT DOCUMENTS

WO          0184172 A1    11/2001
WO     2007036857 A2     4/2007
WO     2014006550 A2     1/2014

OTHER PUBLICATIONS

Gedat, E, et al.: "Prospective Registration of Human Head Magnetic Resonance Images for Reproducible Slice Positioning Using Localizer Images"; Journal of Magnetic Resonance Imaging, Society for Magnetic Resonance Imaging, Oak Brook; pp. 581-587, XP002435215, ISSN: 1053-1807, DOI: 10.1002/JMRI.20153; 2004.
(Continued)

*Primary Examiner* — Reena Aurora
(74) *Attorney, Agent, or Firm* — Laurence Greenberg; Werner Stemer; Ralph Locher

(57) ABSTRACT

A method for automatically updating planning of measurement volumes as a function of object motion during MRI examination of an object in which the planning images a specific subject/object anatomy by MRI, includes defining an object reference pose and a reference coordinate system for the reference pose at a time during MRI examination, with the reference coordinate system being used for planning the measurement volumes. During examination, information is obtained about an object pose change between a current object pose at the time and the reference pose. For each subsequent scan or single acquisition of imaging data during examination, pose change information is used for calculating a new coordinate system for the current pose and updating the planning of measurement volumes as a function of the new coordinate system so the imaged object anatomy
(Continued)

remains the same throughout the scans or acquisitions of imaging data irrespective of object motion.

6 Claims, 2 Drawing Sheets

(51) Int. Cl.
  *G01R 33/56* (2006.01)
  *G01R 33/563* (2006.01)
  *G01R 33/54* (2006.01)
(58) Field of Classification Search
  USPC .......................................................... 324/309
  See application file for complete search history.

(56) References Cited

U.S. PATENT DOCUMENTS

| | | | |
|---|---|---|---|
| 8,036,730 | B1 | 10/2011 | Damadian et al. |
| 8,744,154 | B2 | 6/2014 | Van Den Brink |
| 2001/0020127 | A1 | 9/2001 | Oshio et al. |
| 2015/0182117 | A1 | 7/2015 | Senegas et al. |

OTHER PUBLICATIONS

Nielsen, T. et al.: "Fast Inter-scan Motion Detection and Compensation", Proceeoings of the International Society for Magnetic Resonance in Medicine, 20th Annual Meeting & Exhibition, pp. 2472; XP040624894, / May 5, 2012.

Rajapakse, CS, et al: "Fast prospective registration of in vivo MR images of trabecular bone microstructure in longitudinal studies", Magnetic Resonance in Medicine John Wiley & Sons Inc. vol. 59, No. 5, pp. 1120-1126, XP0027 44182, ISSN: 0740-3194 / May 5, 2008.

Brown.T.T, et al.: "Prospective motion correction of high-resolution magnetic resonance imaging data in children", vol. 53, No. 1, pp. 139-145, XP027182115, ISSN: 1053-8119 / Oct. 15, 2010.

Thesen, S , et al.: "Prospective Acquisition Correction for Head Motion With Image-Based Tracking for Real-Time FMRI", Magnetic Resonance in Medicine, John Wiley & Sons, Inc, vol. 44, No. 3, pp. 457-465, XP000951988, ISSN: 0740-3194, DOI: 10.1002/1522-2594(200009)44:3 457: :AIDMRM173.0.C0;2-R / Jan. 9, 2000.

MacLaren, Julian, et al.: "Prospective Motion Correction in Brain Imaging: A Review", Online Magnetic Resonance in Medicine,vol. 69, No. 3; pp. 621-636; XP002691935, 001: DOI:10.1002/MRM. 24314; http://onlinelibrary.wiley.com/doi/10.1002/mrm.24314/pdf, / Jan. 3, 2013.

Weller, D, S , et al.: "Prospective motion correction for functional MRI using sparsity and Kalman filtering", vol. 8858, 2013, XP002744183, DOI: 10.1117/12.2023074, 2013.

Van Der Kouve A., et al.: "On-line Automatic Slice Positioning and Between-Scan Correction for Brain MR Protocols",International Society for Magnetic Resonance in Medicine, p. 797, XP040588136 / Oct. 7, 2003.

* cited by examiner

METHOD FOR MOTION CORRECTION IN MAGNETIC RESONANCE IMAGING AND MAGNETIC RESONANCE IMAGING APPARATUS

CROSS-REFERENCE TO RELATED APPLICATION

This application claims the priority, under 35 U.S.C. § 119, of European Patent Application EP 15 164 672.6, filed Apr. 22, 2015; the prior application is herewith incorporated by reference in its entirety.

BACKGROUND OF THE INVENTION

Field of the Invention

The present invention relates generally to motion correction in Magnetic Resonance Imaging (MRI).

The effect of object motion, for example motion of the object itself or motion of a part of the object when imaging the object by using MRI techniques, is a common problem which frequently degrades the quality of the MRI images of the object and which might hamper clinical diagnosis or cause the need for rescanning, increasing healthcare costs and impeding patient comfort.

Several measures exist to correct artifacts resulting from object motion, aiming at mitigating the artifacts. For example, some techniques called "navigator techniques" or simply "navigator" try to derive information about the object motion which has occurred from object motion data acquired in a time-effective manner in addition to the image data. In some implementations, those navigators might as well be inherent to the image data, i.e. might be derived directly from the image.

Regardless of which technique is chosen, most of the methods for object motion correction require a reference position of the imaged object with respect to which the subsequent motion measurements, i.e. the measurements of the position of the imaged object over the course of the examination session, are given (referred to as "reference pose" herein). In the prior art, the reference pose is directly connected to the very imaging scan (i.e. the reference pose used for motion correction is only defined per scan, wherein according to the invention a "scan" is a single acquisition and a "measurement session" or "examination" is a collection of "scans" performed on a single object/patient on a single day) which is supposed to be motion-corrected or it is an integral part thereof. Consequently, in consecutive motion-corrected scans, the previously defined reference pose may differ and/or has to be redefined.

Unfortunately, that has a direct impact on the planning and execution of an examination. Typically, an examination starts with the acquisition of an overview or "scout" image ("localizer"), which is used for positioning and orienting the relevant volumes (e.g. slice/slab positions, saturation regions, adjustment volumes, etc.) of all succeeding diagnostic measurements by the operator. However, if the subject moves at some point in time between acquiring the scout image and planning or executing the diagnostic measurement used for the medical imaging, the defined positions of the measurement volumes might no longer be aligned with the desired anatomy. The operator will notice that only after the diagnostic measurement has finished, when the corresponding medical images are available. It might thus turn out that selected measurements have to be repeated.

SUMMARY OF THE INVENTION

It is accordingly an object of the invention to provide a method for motion correction in magnetic resonance imaging and a magnetic resonance imaging apparatus, which overcome the hereinafore-mentioned disadvantages of the heretofore-known methods and apparatuses of this general type and which enable the position of planned measurement volumes to be kept coherent with a desired anatomy irrespective of object motion and across different scans, i.e. changing the measurement volumes that were planned, i.e. the volume planning, according to the motion measurements during the examination session, and which in particular, enable a reference pose to be coherently defined across measurement sessions of the same object or patient, ideally, globally across patients, which will facilitate the reading of the MRI medical images and help to maintain quality standards.

With the foregoing and other objects in view there is provided, in accordance with the invention, a method, preferentially a computer-implemented method, for automatically updating, during an examination of a subject and/or object (hereafter subject/object) by using a MRI apparatus, a planning of measurement volumes, i.e. the definition of the position, orientation and geometry of the measurement volumes (i.e. voxels of a subject/object whose anatomy or activity, will be measured by the MRI apparatus, e.g. position, orientation and geometry of saturation volumes, in particular for the suppression of undesired signal contributions from moving body parts; or position, orientation and geometry of labeling/tagging volumes in particular for arterial spin labeling or for myocardial tagging) in function of a motion of the subject/object, and for a specific subject/object anatomy to be imaged by the MRI apparatus, the method comprising:

a. at a time T0 during the examination of the subject/object by using the MRI apparatus, defining a reference pose for the subject/object and a reference coordinate system for the reference pose, wherein the reference coordinate system allows a determination of the position of the anatomy to be imaged, and performing the planning of measurement volumes as a function of the reference coordinate system defined for the reference pose, i.e. the planning uses the reference coordinate system for defining the position, orientation and geometry of the measurement volumes. Preferentially, the reference pose is either a current pose at the time T0 of the subject/object during the examination, in this case the reference coordinate system is determined from position data acquired at the time T0 during the examination, or a previous pose of the subject/object during a previous examination, in this case the reference coordinate system is equal to a previously determined reference coordinate system characterizing the previous pose and determined from other position data for the same subject/object acquired during a previously performed examination and preferentially stored in a memory of the MRI apparatus and associated with at least one datum disclosing the time, and optionally date, at which the other position data used for defining the previously determined reference coordinate system has been acquired;

b. at a time Ti during the examination that takes place after having defined the reference coordinate system for the reference pose, obtaining information about a pose change of the subject/object between a current pose at the time Ti with respect to the reference pose, the pose change information being obtained notably from position measurements of the subject/object;

c. for each subsequent scan or single acquisition of imaging data taking place during the examination, e.g. taking place at a time Tj, using the pose change information, e.g. previously (i.e. at Ti<Tj) or subsequently (i.e. at Ti>Tj) acquired/obtained, preferentially the last previously or the first subsequently acquired/obtained pose change information, for calculating a new coordinate system for the current pose and updating the planning of measurement volumes as a function of the new coordinate system, the new coordinate system being optionally and additionally used for correlating the imaging data of the subsequent scan with imaging data of other scans, in particular with imaging data of each of the other scans, taking place during the examination and acquired by the MRI apparatus so that all acquired and displayed imaging data coherently match the reference pose and consequently represent the specific anatomy;

d. optionally subsequently repeating steps b. and c. for example for i=1, ... , n, n≥1, until the end of the examination of the subject/object by the MRI apparatus, wherein Tn represents the last time at which pose change information about change in a pose of the object between the current pose at the time Tn and the reference pose at time T0 has been acquired.

As compared to existing prior art techniques, the present invention proposes to define a reference pose and an associated reference coordinate system at some point in time, e.g. before or during the first scan of a measurement session or at some point in time in a previous measurement session, and then to exploit data related to changes of object/subject position, and consequently information about pose changes, acquired, preferentially repeatedly acquired, during examination, e.g. during or shortly before or after a current scan of a subject/object, for determining the current pose of the subject/object and a new coordinate system associated to the reference pose. The reference pose remains the same throughout examination scans of the object/subject by automatically updating the coordinate system as a function of motion of the subject/object. The imaging procedure defines for the reference pose a certain field-of-view (FOV) in the reference coordinate system for imaging the specific anatomy of the subject/object. In order to have subsequent scans acquiring the same FOV of the subject/object irrespective of motion during the same measurement session or, in case a reference coordinate system has been defined for a reference pose that corresponds to a previous pose in a previous measurement session, irrespective of a repositioning of the subject/object, pose change information is acquired and used for determining the new coordinate system that is related to the current position of the subject/object so that the very same FOV is acquired over time irrespective of subject/object motion. According to the present invention, the pose change information is used in subsequent motion correction methods that take place at different time points beyond the scope of the current scan which shall be motion-corrected. The definition of a reference pose that remains the same for all examinations of the subject/object with the MRI apparatus allows the same or coherent reference frame (or coordinate system) to be kept over multiple motion-corrected images.

In particular, the present invention proposes to use one or more sources/techniques for providing position data that can be exploited for the calculation of the new coordinate system as a function of the reference coordinate system defined for the reference pose, and optionally for defining the pose change information and pose information. The sources/techniques are for example additional short scans to obtain only the pose information (also called "navigators") or actual imaging scans, wherein parts of them or the whole scans might be considered for defining the new coordinate system for the reference pose. In particular, the additional "navigators" could be run automatically by the system software without any interaction with the operator, or explicitly.

Preferentially, one of the sources of pose information might be the so-called "scout" or "localizer" scan which is typically performed at the beginning of a MRI measurement session in order to define the scan's reference coordinate system with respect to the anatomy and the corresponding field-of-view (FOV) for subsequent acquisitions. The localizer scan is typically the first scan performed during a MRI scan session and might be, according to the present invention, used for determining and defining the reference pose by, e.g. registering it to an image of the same patient scanned in a previous measurement session or an atlas. In particular, the present invention proposes to store in the memory of, or connected to, the MRI apparatus a reference pose defined for the examined subject/object, and to use the reference pose for defining an image reference frame across measurement sessions, which advantageously further helps the scanner operator, especially if the purpose of a current acquisition is comparison to previously acquired images.

The image reference frame defined across measurement sessions is thus a coordinate system bound to the reference pose. At a time T0 at which a reference pose is defined, the image reference frame and the reference coordinate system defined for the reference pose are identical. Later on, at a time Ti, Ti>T0, the object/subject may have moved so that the reference coordinate system and the image reference frame are no longer identical. The present invention proposes in particular to automatically update the previously defined reference coordinate system as a function of the current pose of a subject/object during examination by calculating a new coordinate system as a function of the current pose (i.e. as a function of the object/subject motion), so that all volumes defined in the reference coordinate system can be adapted to the new pose and the same FOV is kept over time during the examination. The new coordinate system calculated at the time Ti for the current pose of the object/subject and the image reference frame are identical. The new coordinate system at the time Ti is a transformation of the reference coordinate system in order to keep the FOV defined for the reference pose in the reference coordinate system always pointing to the same anatomy of interest for the object/subject. In particular, the reference pose (and current pose updates) might be defined in a control system of the MRI apparatus configured for defining positions of measurement volumes.

In particular, the present invention includes relating information about a current subject/object pose, e.g. position data characterizing the current pose of the subject/object with respect to the scanner coordinate system, to any data acquired for planning purposes, such as data acquired by using the localizer scan, wherein the planning of a measurement by the operator includes setting up a position, an orientation and a geometry of scan/measurement volumes of the subject/object. In particular, the planning might be automated or semi-automated. For example, in a first step, information about the current subject/object pose, e.g. position data, might be extracted from data acquired during the localizer scan or data acquired during contemporarily dedicated scans in order to define the reference pose corresponding to the current pose and associated with the scanner reference coordinate system. And then, in a second step, performing a measurement session including multiple scans and multiple acquisitions of pose change information, wherein preferentially only the latest position data (or information on the current subject/object pose, i.e. pose change information) is used for defining and/or determining the latest coordinate system for the reference pose, before planning or starting a subsequent (diagnostic) scan of the measurement session. Optionally, the present invention includes calculating a time interval dT_i that, when exceeded, automatically triggers a new acquisition of position data for, if needed, calculating the new coordinate system and updating the planning of the subsequent scans (i.e. updating the definition of the position, orientation and geometry of the measurement volumes) in order to be consistent with the planning performed with respect to the reference pose (i.e. with the definition of the position, orientation and geometry of the measurement volumes as defined for the reference pose), wherein the time interval dT_i is the time difference between the time, and optionally date, at which the latest position data has been acquired and the time, and optionally date, at which the planning or starting of the subsequent (diagnostic) scan took place.

The present invention provides the following advantages compared to prior art techniques that will be illustrated in the following three scenarios:

1. If an operator performs the planning of measurement volumes (or checks the results of an automated planning) and if the subject/object moves during or between subsequent scans, then the current basis for the planning (the "localizer") which is linked to the reference pose no longer matches the current position of the subject/object. According to the present invention, having information about this motion available from a position measurement performed explicitly or implicitly by the system (a navigator, an external motion camera, etc.) or from the diagnostic imaging data itself, makes it possible to transform/update the actual planning information by calculating the new coordinate system in order to keep the planning coherent with the anatomy and thus compensating for the movement.
2. If an operator performs the planning (or checks the results of an automated planning) and if the subject/object moves during or between subsequent scans, then the current basis for the planning (the "localizer") no longer matches. According to the present invention, having information about this motion available from a position measurement performed explicitly or implicitly by the system (a navigator, an external motion camera, etc.) or from the diagnostic imaging data itself, makes it possible to reorient the displayed "localizer" data, i.e. the images on which the operator performed the planning, in such a way that it matches the current subject positioning, again ensuring that the planning data stays coherent with the operator user interface output where the planning was performed.
3. If there is no actual planning of the current scan, but planning information from a previous scan is used ("copy references"), i.e. the planning of the current scan is copied from a previous planning, including the reference coordinate system for the reference pose that corresponds to a previous pose of the subject/object, then according to the present invention positional information about the current pose might be obtained during or before the current scan, so that in case of a change of the pose compared to the reference pose, the difference in positioning is used to update the reference coordinate system by calculating a new coordinate system for the current pose and the planning information/data for the current scan.

It is noted that potential movements of the patient table (e.g. for iso-center-scanning) between different measurements can easily be considered in any scenario (1)-(3) described above.

Advantageously, since the reference pose according to the present invention remains the same across acquisitions/measurement sessions by updating position parameters that allow a determination of the new coordinate system as a function of the reference coordinate system and object/subject motion, it is possible to keep a coherent image reference frame for motion-corrected scans in particular by correlating the current coordinate frame (i.e. the coordinate frame for a current scan, i.e. the new coordinate system) and the reference coordinate frame (i.e. the coordinate frame for the reference pose). In particular, in a setting where image navigators are used (i.e. frequently performed, very fast image acquisitions used to derive motion information), the correlation between the current navigator's coordinate and the reference coordinate frame is done by registering the current navigator image to the reference navigator image. Preferentially, in order to keep the reference frame coherent even if a non-motion-corrected acquisition is interleaved in the measurement session, the present invention proposes to acquire additional navigators, for example before and after the non-motion-corrected scan.

The concept of "across-measurement coherent planning" disclosed in the present invention may also be applied to non-image scans, e.g. spectroscopic acquisitions. Indeed, corresponding position data which can be linked to the reference position data (reference pose) can be drawn from those data as well, whether or not by using extra navigator acquisitions. According to the present invention, obtaining the initial positioning, i.e. reference pose and subsequent pose information referring thereto, are not restricted to image-based navigators, but other navigator techniques might be used, such as navigators based on free-induction-signal, or based on k-space, as well as hardware-based techniques.

With the objects of the invention in view, there is concomitantly provided a MRI apparatus configured for performing the previously described method.

Other features which are considered as characteristic for the invention are set forth in the appended claims.

Although the invention is illustrated and described herein as embodied in a method for motion correction in magnetic resonance imaging and a magnetic resonance imaging apparatus, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
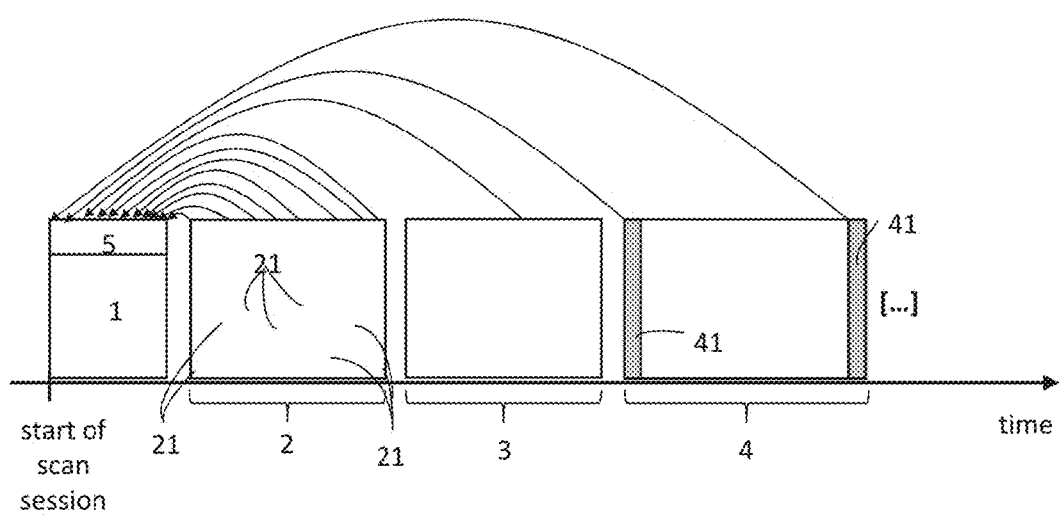
FIG. 1 is a schematic illustration of the claimed method, wherein a localizer serves as a source for a reference pose.
Figure 2:
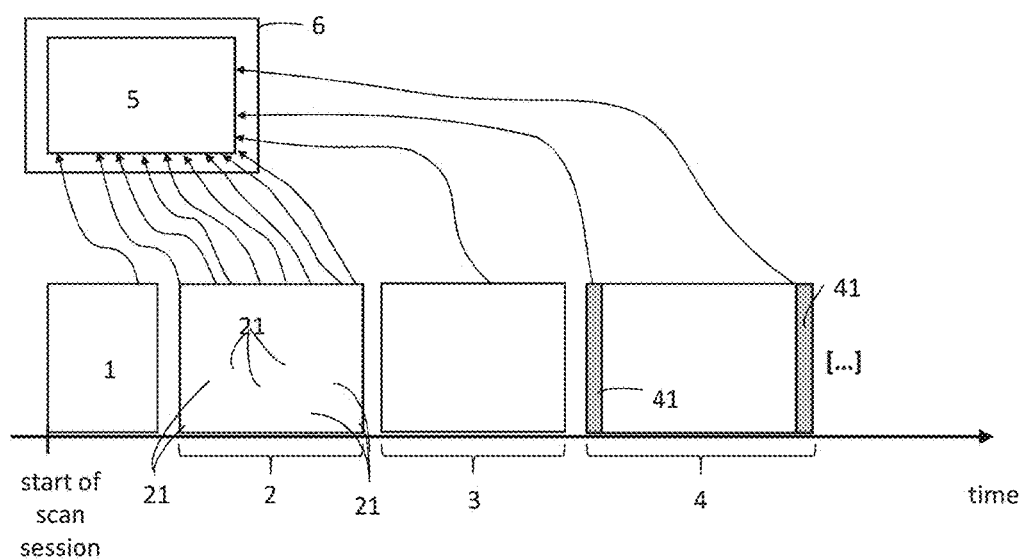
FIG. 2 is a schematic illustration of the claimed method, wherein a previously acquired reference pose serves as a reference pose for a current measurement session.

Referring now to the figures of the drawings in detail and first, particularly, to FIG. 1 thereof, there is seen an illustration of a measurement session or examination of a subject/object including several scans. A first acquisition is a localizer scan 1 which may serve according to the present invention to define a reference pose 5 and to determine a reference coordinate system for the reference pose 5, e.g. by using position parameters. In other words, imaging data obtained by using the imaging apparatus when performing the localizer scan 1 are used for localizing and planning the subsequent MRI acquisition sequences, i.e. subsequent scans, and simultaneously for calculating and determining the reference coordinate system for the reference pose 5, wherein the reference pose 5 is the spatial link between subject/object anatomy that has to be imaged and the image/planning coordinate system, i.e. the reference coordinate system is characterized for instance by the position parameters. After the localizer scan, several subsequent scans are performed which all refer to the reference pose in different ways, i.e. pose change information determined from position data obtained during each of the subsequent scans is used for calculating a geometric transformation/function that, when applied to the reference coordinate system allows a new coordinate system to be calculated, and when applied to images obtained by each of the subsequent scans, makes the reference frame of the images obtained by each of the subsequent scans match with the image reference frame defined by and for the reference pose. Each arrow A_i in FIG. 1, as well as in FIG. 2, represents the relationship between position data at a time Ti and position parameters characterizing the reference coordinate system for the reference pose 5 and that are acquired for instance at a time T0: each position data characterizing the subject/object at a time Ti might be expressed as the geometric function/transformation of the position parameters characterizing the reference pose. For example, an anatomical scan 2 takes place directly after the localizer scan 1 and is motion-corrected by using navigators 21 which are frequently repeatedly interleaved during the anatomical scan. Each of the navigators 21 provides position data that might be used for determining the geometric transformation of the position parameters characterizing the reference coordinate system in order to calculate the new coordinate system. Directly after the anatomical scan 2, a diffusion scan 3 takes place which intrinsically contains navigator information and thus information regarding position data and pose change, by repeatedly acquiring non-diffusion-weighted (b0) image volumes during the diffusion scan 3. Position information obtained by using the diffusion scan 3 can for example be registered to the reference navigator, i.e. the geometric transformation/calculation that defines the pose change of the object that occurred between the current position of the imaged object and its position at the time of the definition of the reference coordinate system, by using the position parameters, so that the reference pose can be obtained by using image registration. The last acquisition sequence is a non-motion-corrected spectroscopic scan 4, which is however also associated with the reference image frame by acquiring dedicated navigators 41 before and after the non-motion-corrected spectroscopic scan 4, preferably being transparent for the operator.

FIG. 2 illustrates the same acquisition sequences as presented in FIG. 1 wherein like reference numbers are used for like objects/features. The method described by using FIG. 2 differs from the method illustrated by FIG. 1 in that the position parameters characterizing the reference coordinate system for the reference pose 5 have been determined in a previous examination session, and preferentially stored in a memory 6 of the MRI apparatus. The reference pose 5 enables the use of a common image reference frame not only across a sequence of acquisitions, but also across examination sessions for the same subject/object.

To summarize, the common image reference frame across different acquisitions as disclosed in the present invention can be exploited in multiple ways. Most intuitively, it can be used to correct/update position parameters for keeping the FOV defined by the user, i.e. the subject/object part which shall be imaged, even if motion occurred during or between scans. Other uses are for example the coherent display of images of one scan session or of one subject/object across sessions. Advantageously, the present invention allows the adaptation of position parameters for keeping the same position and size of the FOV with respect to the specific anatomy of the object/subject that has to be imaged in the case that motion has occurred, even if it occurred between acquisitions. This facilitates later reading of the images as well as supports workflow quality efforts.

The invention claimed is:

1. A method for automatically updating, during an examination of an object by using a magnetic resonance imaging (MRI) apparatus, a planning of measurement volumes as a function of a motion of the object, the planning being configured for imaging of a specific subject/object anatomy by the MRI apparatus, the method comprising the following steps:
   a. at a time T0 during the examination of the object by using the MRI apparatus, defining a reference pose for the object and a reference coordinate system for the reference pose, the reference coordinate system being used for the planning of the measurement volumes;
   b. at a time Ti during the examination, Ti>T0, obtaining information about a pose change of the object between a current pose of the object at the time Ti and the reference pose;
   c. for each subsequent scan or single acquisition of imaging data taking place during the examination, using the pose change information for calculating a new coordinate system for the current pose and updating the planning of measurement volumes in function of the new coordinate system so that the imaged object anatomy remains the same throughout the scans or acquisitions of imaging data irrespective of a motion of the object; and
   d. for one or more subsequent scan or single acquisition of imaging data taking place during the examination, using previously or subsequently acquired pose change information for calculating the new coordinate system.

2. The method according to claim 1, which further comprises subsequently repeating the steps b. and c. for different times Ti until an end of the examination of the object by the MRI apparatus.

3. The method according to claim 1, which further comprises obtaining the pose change information from position measurements of the object.

4. The method according to claim 1, which further comprises providing position data by additional short scans, or actual imaging scans, or a localizer scan.

5. A method for automatically updating, during an examination of an object by using a magnetic resonance imaging (MRI) apparatus, a planning of measurement volumes as a function of a motion of the object, the planning being configured for imaging of a specific subject/object anatomy by the MRI apparatus, the method comprising the following steps:
 a. at a time T0 during the examination of the object by using the MRI apparatus, defining a reference pose for the object and a reference coordinate system for the reference pose, the reference coordinate system being used for the planning of the measurement volumes;
 b. at a time Ti during the examination, Ti>T0, obtaining information about a pose change of the object between a current pose of the object at the time Ti and the reference pose;
 c. for each subsequent scan or single acquisition of imaging data taking place during the examination, using the pose change information for calculating a new coordinate system for the current pose and updating the planning of measurement volumes in function of the new coordinate system so that the imaged object anatomy remains the same throughout the scans or acquisitions of imaging data irrespective of a motion of the object;
 d. selecting the reference pose as either:
  a current pose of the object at the time T0 during the examination, wherein the reference coordinate system is determined from position data acquired at the time T0, or
  a previous pose of the object during a previous examination, wherein the reference coordinate system is equal to a previously determined reference coordinate system characterizing the previous pose and being determined from other position data for the same object acquired during a previously performed examination; and
 e. storing the other position data in a memory of the MRI apparatus and associating the other position data with at least one datum disclosing a time at which the other position data used for defining the previously determined reference coordinate system position parameters has been acquired.

6. A method for automatically updating, during an examination of an object by using a magnetic resonance imaging (MRI) apparatus, a planning of measurement volumes as a function of a motion of the object, the planning being configured for imaging of a specific subject/object anatomy by the MRI apparatus, the method comprising the following steps:
 a. at a time T0 during the examination of the object by using the MRI apparatus, defining a reference pose for the object and a reference coordinate system for the reference pose, the reference coordinate system being used for the planning of the measurement volumes;
 b. at a time Ti during the examination, Ti>T0 , obtaining information about a pose change of the object between a current pose of the object at the time Ti and the reference pose;
 c. for each subsequent scan or single acquisition of imaging data taking place during the examination, using the pose change information for calculating a new coordinate system for the current pose and updating the planning of measurement volumes in function of the new coordinate system so that the imaged object anatomy remains the same throughout the scans or acquisitions of imaging data irrespective of a motion of the object; and
 d. using the new coordinate system for correlating imaging data of the subsequent scan with imaging data of other scans taking place during the examination and acquired by the MRI apparatus so that all acquired and displayed imaging data coherently match the reference pose and consequently represent specific anatomy.

* * * * *